(12) United States Patent
Newsome et al.

(10) Patent No.: US 9,905,783 B2
(45) Date of Patent: Feb. 27, 2018

(54) SOLUTION FOR A SEMICONDUCTING LAYER OF AN ORGANIC ELECTRONIC DEVICE

(71) Applicant: Cambridge Display Technology Limited, Godmanchester (GB)

(72) Inventors: Christopher Newsome, St. Ives (GB); Daniel Tobjork, Cambridgeshire (GB)

(73) Assignee: Cambridge Display Technology Limited, Cambridgeshire (GB)

( * ) Notice: Subject to any disclaimer, the term of this patent is extended or adjusted under 35 U.S.C. 154(b) by 0 days.

(21) Appl. No.: 15/014,779

(22) Filed: Feb. 3, 2016

(65) Prior Publication Data

US 2016/0233438 A1 Aug. 11, 2016

(30) Foreign Application Priority Data

Feb. 9, 2015 (GB) .................................... 1502113.2

(51) Int. Cl.
*H01B 1/12* (2006.01)
*H01L 51/00* (2006.01)
*H01L 51/05* (2006.01)

(52) U.S. Cl.
CPC .......... *H01L 51/0074* (2013.01); *H01B 1/12* (2013.01); *H01L 51/0007* (2013.01); *H01L 51/0566* (2013.01); *H01L 51/0005* (2013.01); *H01L 51/0039* (2013.01)

(58) Field of Classification Search
CPC ............. H01L 51/0074; H01L 51/0039; H01L 51/0005; H01L 51/0558; H01L 51/0007; H01L 51/0566; H01B 1/00; H01B 1/12
See application file for complete search history.

(56) References Cited

U.S. PATENT DOCUMENTS 6,630,566 B1 * 10/2003 Allen ..................... C08G 61/12
250/462.1
7,501,308 B2 * 3/2009 Newsome ........... H01L 51/0005
438/149
9,159,926 B2 * 10/2015 Newsome ........... H01L 51/0007
(Continued)

FOREIGN PATENT DOCUMENTS

WO   WO 2008/077465 A2   7/2008
WO   WO 2011/076324 A1   6/2011
(Continued)

OTHER PUBLICATIONS

Combined Search and Examination Report for corresponding Great Britain application No. GB1502113.2, dated Oct. 26, 2015, pp. 1-6.

*Primary Examiner* — Mark Kopec
*Assistant Examiner* — Jaison P Thomas
(74) *Attorney, Agent, or Firm* — Wolf, Greenfield & Sacks, P.C.

(57) ABSTRACT

Provided is a solution comprising a polymer and an organic semiconductor compound, wherein the semiconductor compound is a thiophene derivative, and wherein the solvent is a mixture comprising a) at least one of 4-methyl anisole, indane and an alkylbenzene with a linear or branched alkyl group containing from 4 to 7 carbon atoms; and b) at least one of tetrahydronaphthalin and 1,2,4-trimethylbenzene.

16 Claims, 5 Drawing Sheets

(4 of 5 Drawing Sheet(s) Filed in Color)

(56) References Cited

U.S. PATENT DOCUMENTS

| | | | |
|---|---|---|---|
| 2014/0319428 A1* | 10/2014 | Blouin | C07D 493/04 252/500 |
| 2015/0108409 A1* | 4/2015 | Meyer | C07D 495/04 252/500 |
| 2016/0272753 A1* | 9/2016 | Nanson | H01L 51/0003 |

FOREIGN PATENT DOCUMENTS

| WO | WO 2014/008971 A1 | 1/2014 |
|---|---|---|
| WO | WO 2014/044359 A1 | 3/2014 |

* cited by examiner

Figure 8b ic semiconductors, has been developed. The motivation for using such blends is primarily to overcome the poor film forming properties of the small molecule semiconductors. Blends exhibit superior film forming properties due to the film forming properties of the polymer. Numerous examples of small molecule semiconductor and polymeric semiconductor blends can be found in the literature.

SOLUTION FOR A SEMICONDUCTING LAYER OF AN ORGANIC ELECTRONIC DEVICE

RELATED APPLICATIONS

This application claims the benefits under 35 U.S.C. § 119(a)-(d) or 35 U.S.C. § 365(b) of British application number GB 1502113.2, filed Feb. 9, 2015, the entirety of which is incorporated herein.

FIELD OF THE INVENTION

The present invention relates to a solution for a semiconducting layer of an organic electronic device, in particular a thin film transistor, to a method of making an organic electronic device, and to a device obtainable by said method.

BACKGROUND

Organic electronic devices include organic light emitting diodes (OLEDs), photovoltaic cells, capacitors, organic field-effect transistors and the like. Transistors may for example be formed by processes wherein their semiconducting layer, and in many cases, other layers, is deposited from solution. The resulting transistors are called thin-film transistors. When an organic semiconductor is used in the semiconducting layer, the device is often described as an organic thin film transistor (OTFT).

Various arrangements for OTFTs are known. One device, an insulated gate-field effect transistor, comprises source and drain electrodes with a semiconducting layer disposed therebetween in a channel region, a gate electrode disposed over the semiconducting layer and a layer of insulating material disposed between the gate electrode and the semiconductor in the channel region.

The conductivity of the channel can be altered by the application of a voltage at the gate. In this way the transistor can be switched on and off using an applied gate voltage. The drain current that is achievable for a given voltage is dependent on the mobility of the charge carriers in the organic semiconductor in the active region of the transistor, namely the channel region between the source and drain electrodes. Thus in order to achieve high drain currents with low operational voltages, organic thin film transistors must have an organic semiconducting layer which has highly mobile charge carriers in the channel region.

High mobility OTFTs containing small molecule organic semiconductors have been reported and the high mobility has been attributed, at least in part, to the highly crystalline nature of the semiconductor. Particularly high mobilities have been reported in single crystal OTFTs wherein the organic semiconductor is deposited by thermal evaporation (see, for example, Podzorov et al, Appl. Phys. Lett., 2003, 83(17), 3504-3506).

Unfortunately, however, it can be difficult to obtain repeatable results from solution processed films of small molecule semiconductors. This is believed to be due to their poor film forming properties. Issues with material reticulation from and adhesion to substrates, film roughness and film thickness variations can limit the performance of small molecule semiconductors in OTFTs. Film roughness can be a further problem for top gate organic thin film transistors as the accumulation layer is formed at the uppermost surface of the semiconducting layer.

To overcome these problems, the use of blends of small molecule semiconductors and polymers, especially polymeric semiconductors, has been developed. The motivation for using such blends is primarily to overcome the poor film forming properties of the small molecule semiconductors. Blends exhibit superior film forming properties due to the film forming properties of the polymer. Numerous examples of small molecule semiconductor and polymeric semiconductor blends can be found in the literature.

Blends of small molecule semiconductor and polymeric semiconductor may be solution processed, e.g. by spin coating or inkjet printing, to form a semiconducting layer. Generally the process involves dissolving the semiconductors in a solvent, spin coating or ink jet printing the solution onto a substrate and then drying the resulting wet film. During the drying step, the solvent evaporates to yield the semiconducting layer comprising a matrix of polymer semiconductor comprising crystals of small molecule semiconductor.

Generally an aromatic or substituted aromatic solvent is used to dissolve the semiconductors. Most commonly o-xylene is used. The driving factor in the selection of this solvent is the fact that it dissolves both small molecule and polymeric semiconductors and it evaporates quickly to form the semiconducting layer.

Most of the prior art relating to small molecule and polymeric semiconductor blends have focussed on selection of certain semiconductors and their ratios in the blend in order to optimise the field effect mobility.

GB2482974 discloses a method of making OTFTs wherein a solvent selected from $C_{1-4}$ alkoxybenzene and $C_{1-4}$ alkyl substituted $C_{1-4}$ alkoxybenzenes is used instead of o-xylene.

U.S. Pat. No. 8,435,810 discloses a method of manufacturing an organic light emitting display device including the steps of providing a panel including a first opening portion formed in a first substrate and a second opening portion spaced apart from the first opening portion, disposing a transmissive-window forming composition in the second opening portion, forming an organic layer in the first opening portion, forming a metal layer on the panel so as to cover the first opening portion and the second opening portion, and forming a transmissive-window by volatilizing the transmissive-window forming composition to open a region of the metal layer corresponding to the second opening portion.

WO 09151978 relates to compositions containing an organic semiconductor dissolved in a solvent mixture wherein the mixture contains an alkane having 9 to 16 carbon atoms in an amount of 1 to 20 weight percent and an aromatic compound in an amount of 80 to 99 weight percent. Also disclosed is a method of making a semiconductor device using the composition to form a semiconductor layer.

SUMMARY OF INVENTION

The present invention provides a solution comprising a polymer and an organic semiconductor compound,
wherein the semiconductor compound is a thiophene derivative or selenaphene derivative, and
wherein the solvent is a mixture comprising a) at least one of 4-methyl anisole, indane and an alkylbenzene with a linear or branched alkyl group containing from 4 to 7 carbon atoms;
and b) at least one of tetrahydronaphthalin and 1,2,4-trimethylbenzene.

The above solution is suitable for the preparation of an active layer of organic electronic device, preferably a field effect transistor.

The present invention also provides a method for preparing a semiconducting layer of an organic electronic device comprising:
(i) depositing said semiconducting layer from a solution comprising a polymer and an organic semiconductor compound, wherein the semiconductor compound is a thiophene derivative or a selenaphene derivative, and wherein the solvent is a mixture comprising a) at least one of 4-methyl anisole, indane and an alkylbenzene with a linear or branched alkyl group containing from 4 to 7 carbon atoms; and b) at least one of tetrahydronaphthalin and 1,2,4-trimethylbenzene; and
(ii) evaporating said solvent.

The present invention further provides a method of making an organic thin film transistor comprising a substrate, source and drain electrodes having a channel region located in between them, a semiconducting layer extending across the channel region and in electrical contact with the source and drain electrodes, a gate electrode and an insulating layer between the gate electrode and the semiconducting layer, wherein the semiconducting layer is deposited from a solution comprising a polymer and an organic semiconductor compound, wherein the semiconductor compound is a thiophene derivative or selenathene derivative, and wherein the solvent is a mixture comprising a) at least one of 4-methyl anisole, indane and an alkylbenzene with a linear or branched alkyl group containing from 4 to 7 carbon atoms; and b) at least one of tetrahydronaphthalin and 1,2,4-trimethylbenzene, followed by evaporating said solvent.

The present invention moreover provides an organic electronic device obtainable by the above method.

Preferred embodiments are set forth in the subclaims and the following detailed description.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

FIGS. 3-7 are in color.

DEFINITIONS

As used herein the term "semiconductor" refers to a compound that can act as either an electrical conductor or insulator depending upon the voltage applied to it. The term "semiconducting layer" refers to a continuous film of material that is semiconducting. The semiconducting layer formed in the present invention comprises a polymer and a semiconductor compound. Preferably the polymer forms a matrix in which the semiconductor compound is dispersed.

As used herein the term "semiconductor compound" refers to small molecule compounds that are semiconductors. The term includes dendrimeric and oligomeric compounds (e.g. dimers, trimers, tetramers and pentamers) that have a polydispersity of 1. The semiconductor compounds are non-polymeric compounds. Preferred non-polymeric semiconductor compounds are crystalline after deposition and annealing.

As used herein the term "lateral distribution" refers to a distribution of semiconductor compound crystals which extend substantially the entire length of the channel between the source and the drain electrodes as well as over the source and drain electrodes, in a direction parallel to the surface of the electrodes.

As used herein the term "aromatic solvent" refers to solvents comprising one or more compounds that comprise a planar ring that has 4n+2 pi electrons, wherein n is a non-negative integer.

As used herein the term "boiling point" refers to the temperature at which boiling occurs at 1 atmosphere of pressure.

As used herein the term "alkyl" refers to saturated, straight chained, branched or cyclic groups. Alkyl groups may be substituted or unsubstituted.

As used herein the term "alkenyl" refers to unsaturated straight chained, branched or cyclic groups. Alkenyl groups may be substituted or unsubstituted.

As used herein the term "alkoxy" refers to O-alkyl groups, wherein alkyl is as defined above.

As used herein the term "amino" refers to primary (i.e. $NH_2$), secondary (NHR) and tertiary amino groups ($NR_2$) wherein R is alkyl as defined above.

As used herein the term "halogen" encompasses atoms selected from the group consisting of F, Cl, Br and I.

As used herein the term "silyl" refers to groups of the formulae —A—SiR'R"R'" wherein A is optionally present and is a saturated or unsaturated group selected from $C_{1-8}$ alkylene, $C_{1-8}$ alkenylene or $C_{1-8}$ alkynylene and each of R', R" and R'" is H or alkyl as defined above.

As used herein the term "stannyl" refers to groups of the formulae —Sn(R')$_r$ wherein r is 1, 2 or 3 and each R' is H or alkyl as defined above.

As used herein the term "amido" refers to groups of the formulae —NHCOR and —NRCOR wherein each R, which may the same or different, is alkyl as defined above.

As used herein the term "aryl" includes single and multiple ring compounds, including multiple ring compounds that contain separate or fused rings. As used herein the term "heteroaryl" refers to aryl groups comprising a heteroatom selected from N, O and S. An example of an aryl group is phenyl, i.e. $C_6H_5$. Phenyl groups may be substituted or unsubstituted. An example of a heteroaryl group is thiophene, i.e. $C_4H_4S$. It may be substituted or unsubstituted. A further example is benzothiophene, which has the following structure. It may also be substituted or unsubstituted.

DESCRIPTION OF THE INVENTION

The present invention provides a solution comprising a polymer, an organic semiconductor compound, and a solvent,
wherein the semiconductor compound is a thiophene derivative or a selenaphene derivative, and
wherein the solvent is a mixture comprising a) at least one of 4-methyl anisole, indane and an alkylbenzene with a linear or branched alkyl group containing from 4 to 7 carbon atoms; and b) at least one of tetrahydronaphthalin and 1,2,4-trimethylbenzene.

The solution of the present invention comprises a polymer and a semiconductor compound which is a thiophene derivative. The solution further comprises a solvent mixture comprising a) at least one of 4-methyl anisole, indane and an alkylbenzene with a linear or branched alkyl group containing from 4 to 7 carbon atoms; and b) at least one of tetrahydronaphthalin and 1,2,4-trimethylbenzene. When the solution is used for the manufacture of semiconductor layers of organic electronic devices, such as thin film transistors, the lateral coverage of the semiconductor film is improved. This in return improves the device mobility.

Advantageously, when using a solution comprising a mixture of solvents comprising a) at least one of 4-methyl anisole, indane and an alkylbenzene with a linear or branched alkyl group containing from 4 to 7 carbon atoms; and b) at least one of tetrahydronaphthalin and 1,2,4-trimethylbenzene, the coverage of the semiconductor compound on the polymer surface of the obtained film is much more even. The crystals of the semiconductor compound align perpendicular to the edge of the film, illustrating that advantageously the morphology of the film can be controlled due to the use of the solvent mixture. In addition, the obtained film shows less so-called coffee ring effect. The coffee ring effect is a pattern left by a puddle of particle-laden liquid after evaporation, a phenomenon which is named for the characteristic ring-like deposit along the perimeter of a spill of coffee.

Preferably solvent a) of the mixture is 4-methyl anisole or an alkylbenzene with a linear or branched alkyl group containing from 4 to 7 carbon atoms. More preferred alkylbenzenes contain a linear alkyl group, i.e. the alkylbenzene is one of butyl-, pentyl-, hexyl- or heptylbenzene. Most preferred is the mixture comprising 4-methyl anisole as solvent a).

Preferably, the solvent mixture comprises solvents a) and b) in a ratio of 10:1 to 1:10. More preferably, the ratio is from 5:1 to 1:5, and even more preferred is the ratio of from 2:1 to 1:2.

The semiconductor compound present in the solution for deposition may be any semiconductor compound suitable for the purpose, e.g. those known to the skilled person skilled in the art as described in the prior art such as those small molecule semiconductors described in WO2010/061176. Suitable non-polymeric semiconductor compounds are commercially available. Typical examples include thiophene derivatives.

Suitable semiconductor compounds include small molecule compounds which advantageously have a significantly higher mobility as compared to semiconducting polymers. Due to the different solubility and surface tension of the semiconductor compounds employed in accordance with the present invention, a vertical phase separation is typically achieved with crystals of the semiconductor compound forming on the top surface. This is especially advantageous for top gate TFTs, since charge transport takes place within a thin layer at the dielectric interface comprising said crytals.

Preferably the semiconductor compound comprises a core of at least three fused rings wherein each ring is independently selected from aromatic rings and heteroaromatic rings that are each individually unsubstituted or substituted with one or more substituents. Exemplary substituents include $C_{1-12}$ alkyl groups, $C_{1-12}$ alkoxy groups, halogens (e.g. F), or silyl groups including trialkylsilyl and trialkylsilylethynyl.

Preferably the semiconductor compound is a benzothiophene derivative and more preferably a benzothiophene derivative of formula (I):

(I)

wherein A is a phenyl group or a thiophene group, said phenyl group or thiophene group optionally being fused with a phenyl group or a thiophene group which can be unsubstituted or substituted with at least one group of formula $X^1$ and/or fused with a group selected from a phenyl group, a thiophene group and a benzothiophene group, any of said phenyl, thiophene and benzothiphene groups being unsubstituted or substituted with at least one group of formula $X^1$; and each group $X^1$ may be the same or different and is selected from the group consisting of (i) unsubstituted or substituted straight, branched or cyclic alkyl groups having from 1 to 20 carbon atoms, alkoxy groups having from 1 to 12 carbon atoms, amino groups that may be unsubstituted or substituted with one or two alkyl groups having from 1 to 8 carbon atoms, each of which may be the same or different, amido groups, silyl groups, unsubstituted or substituted alkenyl groups having from 2 to 12 carbon atoms and unsubstituted or substituted alkynyl groups having from 2 to 12 carbon atoms, or (ii) a polymerisable or reactive group selected from the group consisting of halogens, boronic acids, diboronic acids and esters of boronic acids and diboronic acids, alkenyl groups having from 2 to 12 carbon atoms and stannyl groups.

Examples of alkyl groups include methyl, ethyl, propyl, butyl, pentyl, hexyl, heptyl, octyl, nonyl or decyl. Examples of alkoxy groups include methoxy, ethoxy, propoxy, isopropoxy and butoxy. Examples of amino groups include amino, methylamino, ethylamino and methylethylamino. Examples of silyl groups include trialkylsilyl and trialkylsilylethynyl. Examples of alkenyl groups include ethenyl, propenyl and 2-methylpropenyl.

Possible substituents on the afore-mentioned $X^1$ groups include alkoxy groups having from 1 to 12 carbon atoms, halogen atoms, amino groups that may be unsubstituted or substituted with one or two alkyl groups that may be the same or different and each having from 1 to 8 carbon atoms, acylamino groups having from 2 to 12 carbon atoms, nitro groups, alkoxycarbonyl groups having from 2 to 7 carbon atoms, carboxyl groups, aryl groups having from 5 to 14 carbon atoms and 5- to 7-membered heteroaryl groups containing from 1 to 3 sulfur atoms, oxygen atoms, selenium atoms and/or nitrogen atoms.

In preferred benzothiophene derivatives of formula (I) A is selected from:

a thiophene group that is fused with a phenyl group substituted with at least one group of formula $X^1$; or a phenyl group that may be unsubstituted or substituted with at least one group of formula $X^1$, said phenyl group further optionally being fused with a thiophene group which can be unsubstituted or substituted with at least one group of formula $X^1$ and/or fused with a benzothiophene group, said benzothiphene group being unsubstituted or substituted with at least one group of formula $X^1$.

In particularly preferred benzothiophene derivatives A is a thiophene group that is fused with a phenyl group substituted with at least one group of formula $X^1$.

In preferred benzothiophene deriatives each $X^1$ is the same. Particularly preferably $X^1$ is selected from the group consisting of unsubstituted or substituted straight, branched or cyclic alkyl groups having from 1 to 20 carbon atoms, alkoxy groups having from 1 to 12 carbon atoms, amino groups that may be unsubstituted or substituted with one or two alkyl groups having from 1 to 8 carbon atoms, each of which may be the same or different, amido groups, silyl groups and alkenyl groups having from 2 to 12 carbon atoms. Still more preferably $X^1$ is selected from the group consisting of unsubstituted or substituted straight, branched or cyclic alkyl groups having from 1 to 20 carbon atoms. Yet more preferably $X^1$ is a group of formula $C_nH_{2n+1}$ wherein n is 0 or an integer of from 1 to 16, more preferably from 4 to 16.

Examples of preferred non-polymeric semiconductors are shown below:

wherein $X^1$ is as defined above in relation to formula (I). More preferably the semiconductor compound is of formula (Ia). Yet more preferably the semiconductor compound is:

wherein $R^7$ and $R^8$ are the same or different and each is independently selected from the group consisting of hydrogen and a linear, branched or cyclic alkyl group having from 1 to 16 carbon atoms.

Examples of preferred alkyl groups for $R^7$ and $R^8$ are selected from the group consisting of methyl, ethyl, propyl, butyl, pentyl, hexyl, heptyl, octyl, nonyl or decyl. More preferred is $R^7$ and $R^8$ being hexyl, or heptyl. It is further preferred that $R^7$ and $R^8$ are the same.

Most preferably, the semiconductor compound is of the following formulae:

Most preferred is the semiconductor compound being according to formula (IIb).

Small molecule organic semiconductors of this type can be prepared as described in WO2012046818, WO2012137694, JP2012219015, WO2011004869, WO2012008490 and J. Mater. Chem., 2012, 22, 7715-7717.

Preferably, the polymer of the solution comprises a repeat unit of formula (IIIa)

wherein $R^1$ and $R^2$ are the same or different and each is selected from the group consisting of hydrogen, an alkyl group having from 1 to 16 carbon atoms, an aryl group having from 5 to 14 carbon atoms and a 5- to 7-membered heteroaryl group containing from 1 to 3 sulfur atoms, oxygen atoms, selenium atoms, and/or nitrogen atoms, said aryl group or heteroaryl group being unsubstituted or substituted with one or more substituents selected from an alkyl group having from 1 to 16 carbon atoms and an alkoxy group having from 1 to 16 carbon atoms.

Examples of alkyl groups include methyl, ethyl, propyl, butyl, pentyl, hexyl, heptyl, octyl, nonyl or decyl. Examples of aryl groups include phenyl, indenyl, naphthyl, phenanthrenyl and anthracenyl groups. Examples of 5- to 7-membered heteroaryl groups include furyl, thienyl, pyrrolyl, azepinyl, pyrazolyl, imidazolyl, oxazolyl, isoxazolyl, thiazolyl, isothiazolyl, 1,2,3-oxadiazolyl, triazolyl, tetrazolyl, thiadiazolyl, pyranyl, pyridyl, pyridazinyl, pyrimidinyl and pyrazinyl groups. Examples of alkoxy groups include methoxy, ethoxy, propoxy, isopropoxy and butoxy.

In preferred polymers $R^1$ and $R^2$ are the same.

Preferred polymers comprise a repeat unit of formula (IIIa) wherein, wherein $R^1$ and $R^2$ are each selected from the group consisting of hydrogen, an alkyl group having from 1 to 12 carbon atoms and an aryl group, preferably the aryl group is a phenyl group, said aryl group being unsubstituted or substituted with one or more substituents selected from an alkyl group having from 1 to 12 carbon atoms and an alkoxy group having from 1 to 12 carbon atoms. Still more preferred polymeric semiconductors comprise a repeat unit of formula (IIIa) wherein $R^1$ and $R^2$ are each selected from the group consisting of an alkyl group having from 4 to 12 carbon atoms and a phenyl group, said phenyl group being unsubstituted or substituted with one or more substituents selected from an alkyl group having from 4 to 8 carbon atoms and an alkoxy group having from 4 to 8 carbon atoms. Yet further preferred polymeric semiconductors comprise a repeat unit of formula (IIIa) wherein $R^1$ and $R^2$ are each selected from the group consisting of an alkyl group having from 4 to 12 carbon atoms, preferably butyl, pentyl, hexyl, heptyl, octyl, nonyl or decyl, particularly octyl, e.g. n-octyl.

Further preferred polymers comprise a repeat unit of formula (IIIb):

wherein $Ar^1$ and $Ar^2$ are the same or different and each is selected from an aryl group having from 5 to 14 carbon atoms and a 5- to 7-membered heteroaryl group containing from 1 to 3 sulfur atoms, oxygen atoms, selenium atoms, and/or nitrogen atoms, said aryl group or heteroaryl group being unsubstituted or substituted with one or more substituents selected from an alkyl group having from 1 to 16 carbon atoms and an alkoxy group having from 1 to 16 carbon atoms;
$R^3$ is an alkyl group having from 1 to 8 carbon atoms or a phenyl group which may be unsubstituted or substituted with an alkyl group having from 1 to 8 carbon atoms;
and n is an integer greater than or equal to 1, preferably 1 or 2.

Examples of aryl groups include fluorenyl, phenyl, indenyl, naphthyl, phenanthrenyl and anthracenyl groups. Examples of 5- to 7-membered heteroaryl groups include furyl, thienyl, pyrrolyl, azepinyl, pyrazolyl, imidazolyl, oxazolyl, isoxazolyl, thiazolyl, isothiazolyl, 1,2,3-oxadiazolyl, triazolyl, tetrazolyl, thiadiazolyl, pyranyl, pyridyl, pyridazinyl, pyrimidinyl and pyrazinyl groups. Examples of alkyl groups include methyl, ethyl, propyl, butyl, pentyl, hexyl, heptyl, octyl, nonyl or decyl. Examples of alkoxy groups include methoxy, ethoxy, propoxy, isopropoxy and butoxy.

In preferred polymers comprising a repeat unit of formula (IIIb) $Ar^1$ and $Ar^2$ are the same. Particularly preferably each of $Ar^1$ and $Ar^2$ is a phenyl group, preferably an unsubstituted phenyl group.

In further preferred polymers comprising a repeat unit of formula (IIIb) $R^3$ is an alkyl group having from 1 to 8 carbon atoms or a phenyl group which may be unsubstituted or substituted with an alkyl group having from 1 to 8 carbon atoms. Particularly preferably $R^3$ is alkyl group, especially an alkyl group comprising 2 to 5 carbon atoms, e.g. ethyl, propyl, butyl, pentyl. Still more preferably $R^3$ is a phenyl group substituted with an alkyl group having from 1 to 8 carbon atoms, e. g. ethyl, propyl, butyl, pentyl.

Still more preferably the polymer present in the solution or blend for deposition comprises a repeat unit of formula (IIIa) and a repeat unit of formula (IIIb). Preferably the ratio of repeat unit of formula (IIIa) to formula (IIIb) is in the range 3:1 to 1:3, more preferably 2:1 to 1:2 and still more preferably about 1:1. Particularly preferably the polymer comprises a repeat unit of formula (IIIc):

wherein $R^1$, $R^2$, $Ar^1$, $Ar^2$ and $R^3$ are as defined above in relation to formulae (IIIa) and (IIIb).

Yet more preferably the polymer is TFB [9,9'-dioctylfluorene-co-N-(4-butylphenyl)-diphenylamine]n, wherein n is greater than 50, more preferably more than 100.

The present invention further provides a method for preparing a semiconducting layer of an organic electronic device comprising:
(i) depositing said semiconducting layer from a solution comprising a polymer, an organic semiconductor compound, and a solvent, wherein the semiconductor compound is a thiophene derivative or a selenaphene derivative, and wherein the solvent is a mixture comprising a) at least one of 4-methyl anisole, indane and an alkylbenzene with a linear or branched alkyl group containing from 4 to 7 carbon atoms; and b) at least one of tetrahydronaphthalin and 1,2,4-trimethylbenzene; and
(ii) treating said deposited layer to evaporate said solvent, for example by heating or vacuum drying.

Preferably, depositing is carried out by printing, very preferably by inkjet printing. Also preferred is the organic electronic device being an organic thin film transistor.

The present invention further provides a method of making an organic thin film transistor comprising a substrate, source and drain electrodes having a channel region located in between them, a semiconducting layer extending across the channel region and in electrical contact with the source and drain electrodes, a gate electrode and an insulating layer between the gate electrode and the semiconducting layer, wherein the semiconducting layer is deposited from a solution comprising a polymer, an organic semiconductor compound, and a solvent, wherein the semiconductor compound is a thiophene derivative or a selenaphene derivative, and wherein the solvent is a mixture comprising a) at least one of 4-methyl anisole, indane and an alkylbenzene with a linear or branched alkyl group containing from 4 to 7 carbon atoms; and b) at least one of tetrahydronaphthalin and 1,2,4-trimethylbenzene, followed by heating said deposited layer to evaporate said solvent.

The suppression of evaporation of solvent during the deposition step is achieved by using a mixture of the at least two solvents to form the solution used in deposition.

The organic electronic device obtainable with the method of the present invention comprises:
i) a substrate;
ii) source and drain electrodes deposited on said substrate and having a channel region located in between them;
iii) a semiconducting layer formed with the solution of the present invention deposited over at least a portion of said source and drain electrodes and in said channel region;
iv) an insulating layer deposited over said semiconducting layer; and
v) a gate electrode deposited on said insulating layer.

Alternatively, the organic electronic device obtainable with the method of the present invention comprises:
i) a substrate;
ii) a gate electrode deposited on said substrate;
iii) an insulating layer deposited over said gate electrode;
iv) source and drain electrodes deposited on said insulating layer and having a channel region located in between them;
v) a semiconducting layer formed with the solution of the present invention deposited over at least a portion of said source and drain electrodes and in said channel region.

Deposition of the semiconducting layer of the organic device formed with the solution of the present invention is carried out from solution, wherein any conventional solution-based processing method may be used. Representative examples of solution-based printing methods include dispense printing, slot die coating, doctor blade coating ink-jet printing, and gravure or flexographic printing. In preferred methods of the invention, however, depositing is carried out by inkjet printing.

Preferably, deposition is carried out on the pre-warmed substrates, wherein the substrate preferably have been pre-heated to about 40 to 70° C., preferably about 50° C.

The solution of the present invention is particularly advantageous when the semiconducting layer is deposited over source and drain electrodes that have been pre-treated with a surface modifying compound, such as a fluorinated benzenethiol. Such pre-treatments are carried out to reduce the contact resistance of the devices through an increase in the work function of the metal contact.

In preferred embodiments of the invention at least a part of one surface, more preferably at least one surface, of each of the electrodes of the organic electronic device is coated with a surface-modifying compound. Preferred surface-modifying compounds form a self-assembled monolayer (SAM). The surface modifying compound preferably reduces contact resistance between the semiconductors and the electrodes by altering the work function of the source and drain electrodes.

Preferably the surface-modifying material is of formula (V)

Bind-(Sp)$_z$—Org     (V)

wherein
Bind is a binding group, preferably a thiol;
Sp is a spacer group, preferably a $C_{1-12}$ alkyl or $C_{6-10}$ aryl group;
z is 0 or 1, preferably 0; and
Org is a conjugated organic group, preferably phenyl substituted by one or more fluorine atoms.

The surface-modifying compound is preferably a fluorinated benzenethiol, Molybdenum tris-[1,2-bis(trifluoromethyl)ethane-1,2-dithiolene] (Mo(tfd)$_3$), or 2,3,5,6-tetrafluoro-7,7,8,8-tetracyanoquinodimethane (F4TCNQ). Representative examples of suitable fluorinated benzenethiol compounds include pentafluorobenzenethiol. Alternatively, a fluorinated fullerene may be employed, such as $C_{60}F_{36}$. The surface-modifying compound may be applied to the electrodes using any conventional method known in the art.

The present invention provides solutions for semiconducting layers which have a high charge carrier mobility. The semiconducting layer of the organic preferably has a thickness of 20 to 80 nm, more preferably 30 to 60 nm, and even more preferably of 40 to 50 nm.

The semiconducting layer may be incorporated into any organic electronic device that benefits from improved mobility. Preferably, however, the organic electronic device is an organic thin film transistor. The transistors can be p-type or n-type. Suitable transistor configurations include top-gate transistors and bottom-gate transistors.

In one preferred embodiment the organic electronic device is a top gate transistor. In this case the source and drain electrodes having a channel region located in between them are preferably deposited on a substrate, and the semiconducting layer is deposited over at least a portion of the source and drain electrodes and in said channel region. Preferably at least a part of one surface, more preferably at least one surface, of each of the electrodes is pre-coated with a surface-modifying compound. Preferably the device further comprises an insulating layer on the surface of the semiconducting layer. Still more preferably the device further comprises a gate electrode on the insulating layer.

In another preferred embodiment the organic electronic device is a bottom gate transistor. In this case, the source and drain electrodes having a channel region located in between them are deposited on a substrate on which a gate electrode and an insulating layer have already been deposited, and the semiconducting layer is deposited over at least a portion of the source and drain electrodes and in the channel region. Preferably at least a part of at least one surface, more preferably at least one surface, of each of the electrodes is coated with a surface-modifying compound as described above. A low surface tension polymer is preferably employed for the coating, more preferably a low surface tension fluorinated polymer. Due to said coating, it is ensured that the vertical phase separation of the semiconductor compound is inverted and a high mobility channel is formed.

Among the above embodiments, a top gate thin film transistor is more preferred.

Figure 1:
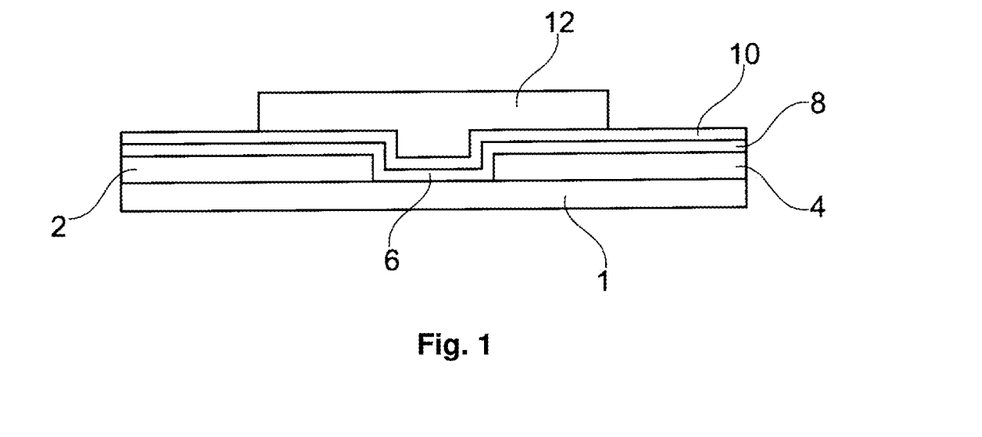
FIG. 1 is a schematic of a typical top gate or top contact geometry thin film transistor.

Referring to FIG. 1, a schematic of a top gate thin film transistor is illustrated. The structure may be deposited on a substrate 1 and comprises source and drain electrodes 2, 4 which are spaced apart with a channel region 6 located therebetween. An organic semiconductor 8 is deposited in the channel region 6 and may extend over at least a portion of the source and drain electrodes 2, 4. An insulating layer 10 of dielectric material is deposited over the organic semiconductor 8 and may extend over at least a portion of the source and drain electrodes 2, 4. Finally, a gate electrode 12 is deposited over the insulating layer 10. The gate electrode 12 is located over the channel region 6 and may extend over at least a portion of the source and drain electrodes 2, 4.

Figure 2:
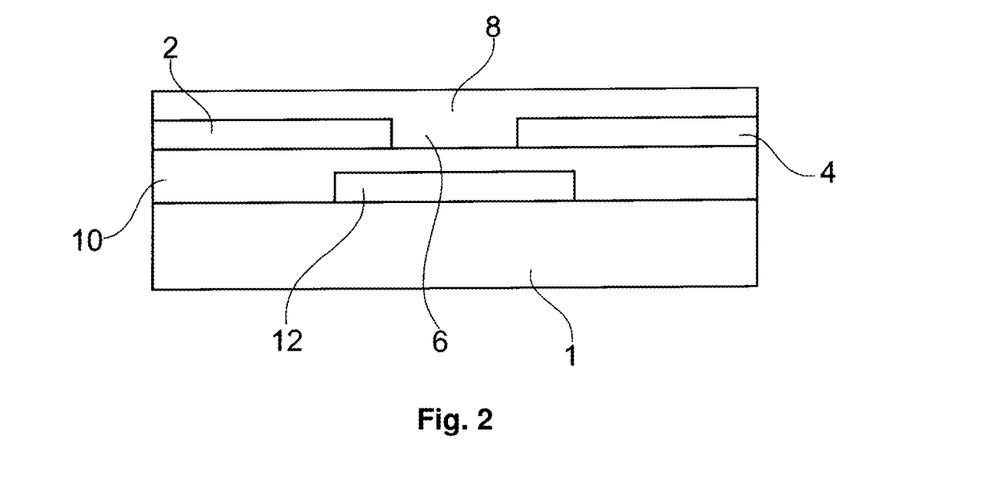
FIG. 2 is a schematic of a typical bottom gate thin film transistor.

FIG. 2 shows a schematic of a bottom gate thin film transistor. In FIG. 2 like reference numerals have been used for corresponding parts to FIG. 1. The bottom-gate structure illustrated in FIG. 2 comprises a gate electrode 12 deposited on a substrate 1 with an insulating layer 10 of dielectric material deposited thereover. Source and drain electrodes 2, 4 are deposited over the insulating layer 10 of dielectric material. The source and drain electrodes 2, 4 are spaced apart with a channel region 6 located therebetween over the gate electrode. An organic semiconductor 8 is deposited in the channel region 6 and may extend over at least a portion of the source and drain electrodes 2, 4.

The conductivity of the channel of the transistors can be altered by the application of a voltage at the gate. In this way the transistor can be switched on and off using an applied gate voltage. The drain current that is achievable for a given voltage is dependent on the mobility of the charge carriers in the channel region between the source and drain electrodes. Thus, in order to achieve high drain currents with low operational voltages, organic thin film transistors must have an organic semiconductor which has highly mobile charge carriers in the channel region.

The electrodes (source, drain and gate) are preferably 20 to 300 nm thick and more preferably 40 to 250 nm. The insulating layer is preferably 10 to 2000 nm thick and more preferably 300 to 400 nm. More preferred when using a top gate geometry for the TFT is the thickness of the respective gate electrode being in the range of from 70 to 250 nm while the thickness of the source and drain electrodes are in the range of from 20 to 60 nm.

The substrate may be any material conventionally used in the art such as glass or plastic (e.g. of PEN or PET type). Optionally the substrate is pre-treated to improve adhesion thereto. Preferred is a PEN substrate.

The source, drain and gate electrodes may be selected from a wide range of conducting materials. Representative examples include a metal (e.g. chromium, titanium, gold, aluminium, silver, copper, nickel), a metal alloy, a metal compound (e.g. indium tin oxide) or a conductive polymer. Preferably the source, drain and gate electrodes are metal. More preferably the source and drain electrodes are Cr/Au. More preferably the gate electrode is Al.

The insulating layer is preferably a dielectric. Any conventional dielectric may be used. Representative examples of suitable dielectrics include polytetrafluoroethylene (PTFE), perfluoro cyclo oxyaliphatic polymer (CYTOP), perfluoroalkoxy polymer resin (PFA), fluorinated ethylene-propylene (FEP), polyethylenetetrafluoroethylene (ETFE), polyvinylfluoride (PVF), polyethylenechlorotrifluoroethylene (ECTFE), polyvinylidene fluoride (PVDF), polychlorotrifluoroethylene (PCTFE), perfluoro elastomers (FFKM) such as Kalrez® or Tecnoflon®, fluoro elastomers such as Viton®, perfluoropolyether (PFPE) and a polymer of tetrafluoroethylene, hexafluoropropylene and vinylidene fluoride (THV). Fluorinated polymers are an attractive choice for the dielectric, particularly in the field of organic thin film transistors (OTFTs), because they possess a number of favourable properties including: (i) excellent spin coating properties, for instance: (a) wetting on a wide variety of surfaces; and (b) film formation, with the option of doing multi-layer coatings; (ii) chemical inertness; (iii) quasi-total solvent orthogonality: consequently, the risk of the organic semiconductor being dissolved by the solvent used for spin-coating the dielectric is minimal; and (iv) high hydrophobicity: this can be advantageous because it results in low water uptake and low mobility of ionic contaminants in the fluorinated polymer dielectric (low hysteresis).

Preferred devices of the present invention have one or more of the following structural characteristics:
Substrate: PEN substrate
Source and drain electrodes: Gold
Source and drain electrode thickness: 5 to 200 nm
Electrode SAM: pentafluorobenzenethiol
SAM thickness: less than 10 nm
Channel length: less than 20 micrometer
Semiconducting layer thickness: 20 to 60 nm
Insulating layer: PTFE
Insulating layer thickness: 50 to 500 nm
Gate electrode: Aluminium
Gate electrode thickness: 20 to 300 nm The organic devices of the present invention advantageously comprise a semiconducting layer wherein the semiconductor compound is distributed homogeneously in the semiconducting layer in the direction parallel to the surface of the electrodes (while vertical phase separation occurs as indicated further above).

The improved lateral distribution of the semiconductor compound in the semiconducting layer manifests itself in reduced contact resistance, particularly for short channel length devices (<20 μm). In short channel length devices contact resistance can contribute a significant proportion to the total channel resistance in the device. The higher the contact resistance in the device, the higher the proportion of the applied voltage is dropped across the source and drain contacts and, as a result, the lower the bias across the channel region is achieved. A high contact resistance has the effect of a much lower current level being extracted from the device due to the lower bias applied across the channel region, and hence lower device mobility.

In the following, the invention will be further illustrated on the basis of examples.

EXAMPLES

Device Characterisation:

AFM was carried out using a Veeco Nanoscope apparatus. The produced devices were measured in ambient conditions (no device encapsulation was used) using a Hewlett Packard 4156C semiconductor parameter analyser by measuring output and transfer device characteristics. Device mobility was calculated from the transfer data in the saturation regime. The mobility is a measure of how much current is delivered through the device, and it does not necessarily refer to the intrinsic mobility of the semiconductor material itself (although in many instances this is true). For example, a device with the same mobility of material in the channel region may exhibit a higher contact resistance as compared to another device, therefore exhibiting a lower "device" mobility.

Comparative Example 1

A mixture of LP-8:F8-TFB in a solution of tetrahydronaphthalin (alone) was printed to form a film onto a glass substrate with wet etched source and drain contacts and lead-outs, followed by a drying step. F8-TFB is the copolymer poly(9,9-di-n-octylfluorene-alt-N-(4-butylphenyl)diphenylamine)

Figure 3:
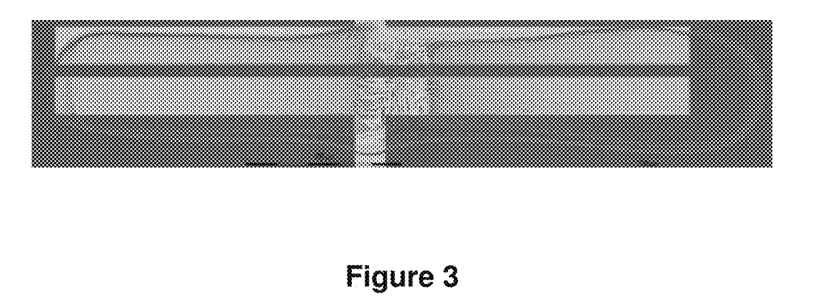
FIG. 3 shows a film obtained with the solution of Comparative Example 1.

In the final film, a large coffee stain effect was observed, mainly consisting of the polymeric semiconductor compound (F8-TFB). Most of the semiconductor compound material ended up in form of thick crystals in the very centre of the printed structure. In FIG. 3, said results are shown. The large aggregation of thick semiconductor compound crystals in the centre of the printed feature is due to the drying kinetics of the solution.

Figure 4:
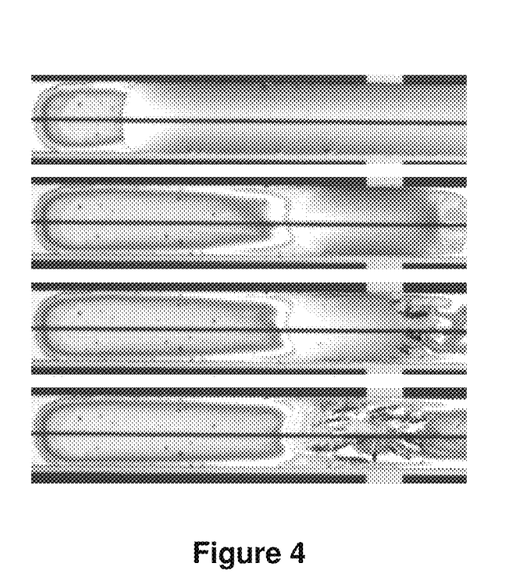
FIG. 4 illustrates the drying kinetics of a solution.

The drying kinetics are illustrated in FIG. 4. The solution was printed inside a low resolution non-wetting bank-pattern (Zeon with Solvay additive) on glass in order to prevent too much spreading. It is evident that crystallisation of the semiconductor compound starts after most of the majority of the solvent evaporated (second picture form the right), and thick crystals are left mainly in the central area of the pattern after complete evaporation (most right picture).

Comparative Example 2

A mixture of LP-8:F8-TFB in a solution of mesitylene (alone) was printed to form a film, followed by a drying step. Mesitylene has a lower surface tension and boiling point than tetrahydronaphthalin used as the solvent in Comparative Example 1. However, the observed coffee stain effect was even greater as compared to the results of Comparative Example 1. Most of the high mobility semiconductor compound ended up around the edges of the obtained film.

Example 1

A mixture of LP-8:F8-TFB in a solution comprising tetrahydronaphthalin and 4-methylanisole was used to form a film. As a result, an improved semiconductor compound morphology of the film is obtained, as illustrated by the cross-polarised optical microscope image of FIG. 5. As is evident therefrom, the coffee stain effect is greatly reduced, although still visible the edges.

Figure 5:
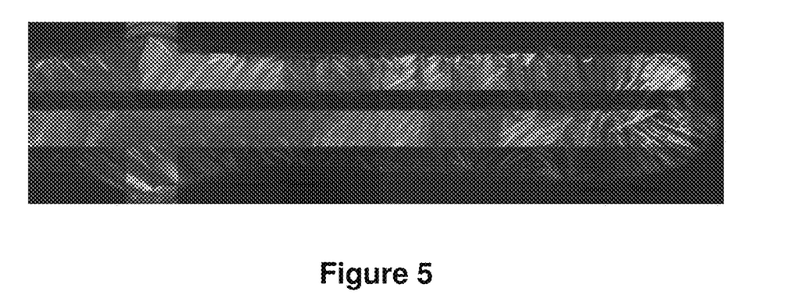
FIG. 5 is a cross-polarised optical microscope image of the film of Example 1.

As may be further seen from FIG. 5, the whole surface of the printed pattern is covered with relatively large semiconductor compound crystals, as is shown by the bright vs. dark areas in the cross-polarised optical micrograph. The central region (i.e. transistor channel) advantageously is richer in the amount of small-molecule semiconductor material, while the edge is mainly polymer based.

The semiconductor compound crystals preferentially orient from the edge of the pattern towards the central region of the printed features. This is attributed to the drying kinetics of the film from the edge, i.e. enhanced evaporation occurs due to solvent vapour pressure aspects, where the semiconductor crystals are nucleated and then grow towards the centre. Thus, when printing the organic semiconductor ink across the source and drain contacts using the solution in accordance with the present invention, an ideal coverage of semiconductor compound single crystals across the whole transistor channel is obtained.

The coverage of single semiconductor compound crystals across the whole transistor channel potentially obtained with the solution of the present invention enables much higher performance, i.e. higher field effect mobility of OTFTs than with semiconductor layers of the prior art where the current is limited by the boundaries between the semiconductor crystals and the lower mobility polymer matrix, or compared with the poor coverage of the surface obtained in Comparative Example 1.

The result of many parallel semiconductor compound crystals overlapping the transistor channel region may also help in reducing the statistical variation in the performance, i.e. a standard deviation in mobility below 1 to 15%.

Figure 6A:
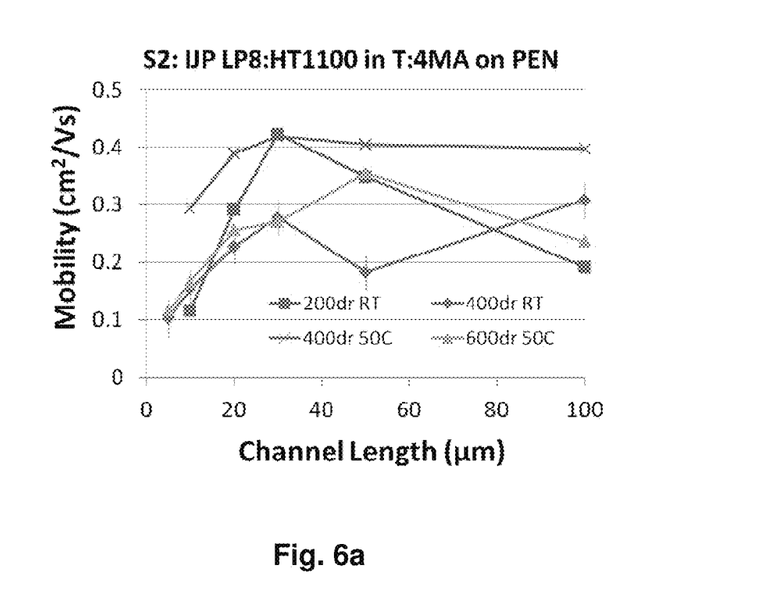
FIGS. 6*a* and 6*b* illustrate the charge carrier mobility data of the film of Example 1 as a function of the channel length for different print conditions on glass and on plastic substrates.
Figure 6B:
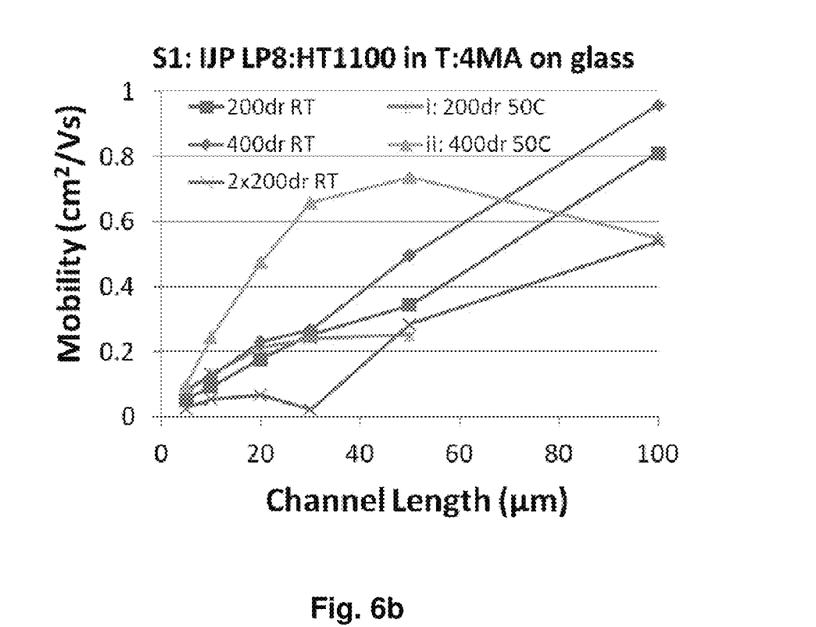

The OTFTs fabricated by inkjet printing using a solution comprising 0.9% LP8: F8-TFB in a ratio of from 25:75 in a solvent mixture of tetrahydronaphthalin:4-methylanisole (1:1 ration) onto C60F36-treated Au-S/D contacts on glass and on PEN showed a good performance with a current on/off ratio of >10$^6$ and charge carrier mobility of up to almost 1 cm$^2$/Vs at a channel length of 100 μm. The charge carrier mobility data are shown as a function of the channel length for different print conditions on glass and on plastic substrates in the graph of FIGS. 6a and 6b. Conditions such as the temperature at which the films were deposited were also tested as part of the printing process. Overall, even better lateral crystal coverage was obtained when the films were deposited on heated substrates at 50° C.

Figure 7A:
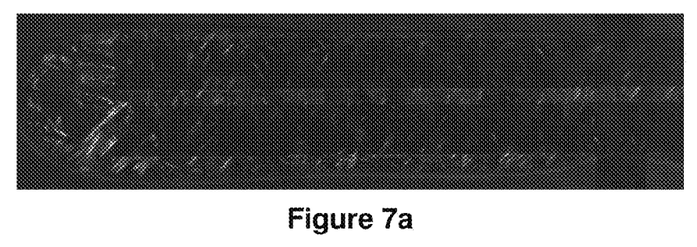
FIGS. 7*a* to 7*d* show polarised optical images taken at different temperatures for the film of Example 1.
Figure 7B:
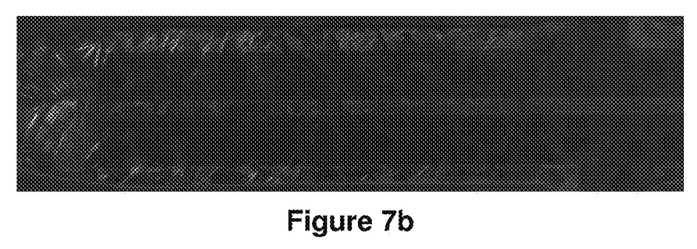
Figure 7C:
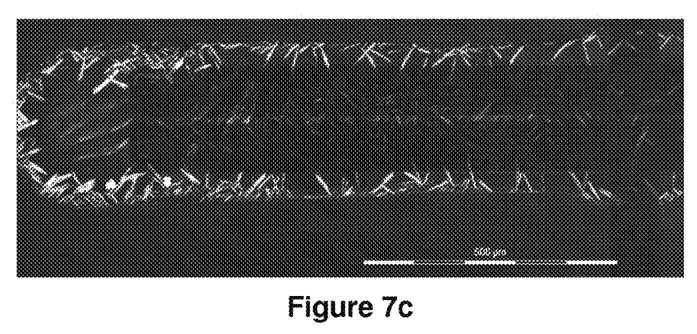
Figure 7D:
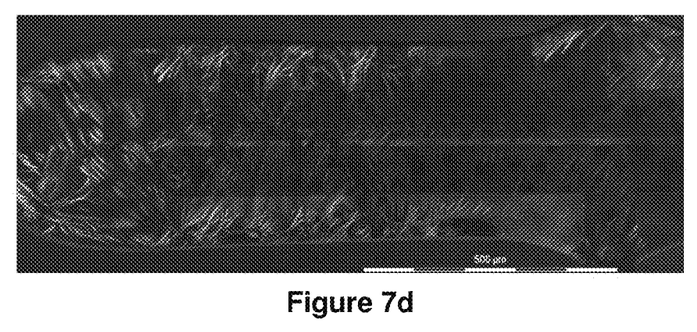

Polarised optical images are shown in FIGS. 7a to 7d where the crystalline semiconductor compound can be identified as bright coloured features. In the cases where films were deposited at room temperature (RT) illustrated in FIG. 7a, the semiconductor material tended to form isolated crystals in the polymer matrix or at least the z-growth of the crystals becomes an issue. On the other hand, at elevated temperatures (here 50° C.) illustrated in FIGS. 7b-d, an improvement in the continuity of the crystalline material was obtained. In FIG. 7c, multiple printings were employed which resulted in less spreading but thick (bright) needle like small molecule crystals forming semiconductor material at the edges. In FIG. 7d, double the volume was printed in one print run by reducing the drop spacing, which lead to a wider print pattern.

Figure 8A:
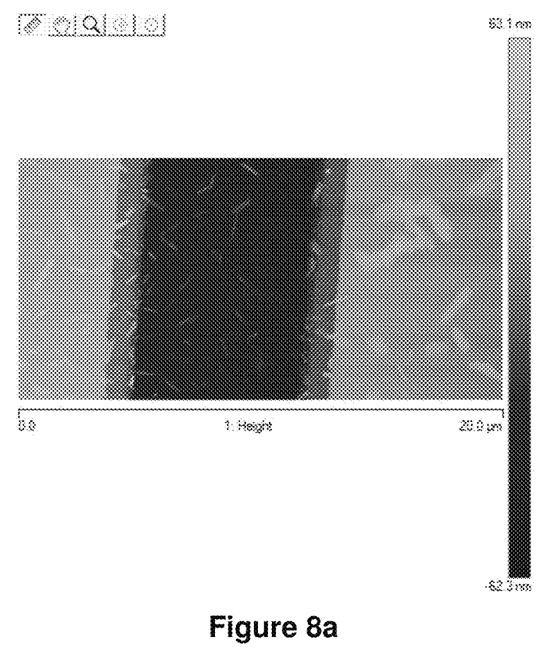
FIGS. 8*a* and 8*b* show atomic force microscopy analysis of the printed blend films of Comparative Example 1 and Example 1.
Figure 8B:
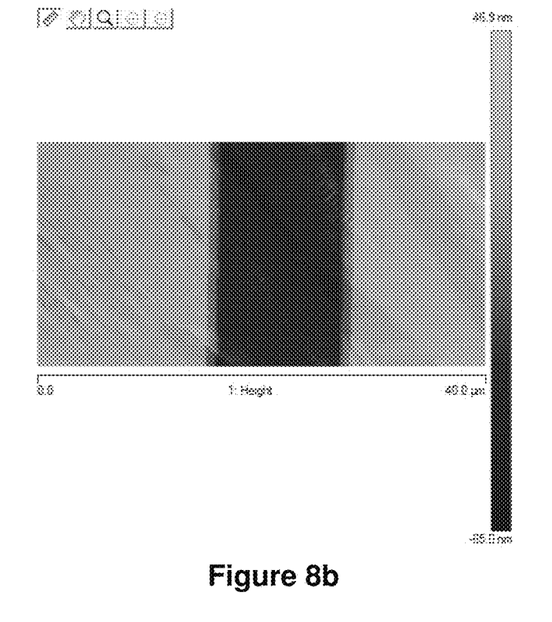

For comparison, atomic force microscopy analysis of the printed blend films was conducted to understand the crystalline film structure when comparing a film deposited from a single solvent to a blend solvent system. FIGS. 8a and 8b show the contrast in the lateral coverage of the small molecule crystal component in the active region of the device without dielectric in place. In case of using the mesitylene solution of Comparative Example 2, isolated domains of the material can be clearly identified with sizes in the range of a few micrometers, as shown in FIG. 8a. In the case where a solvent mixture in accordance with the present invention (tetrahydronaphthalin:4-methylanisole ratio of 1:1) was used to deposit the same blend, an improved lateral coverage can be identified where crystals extending several tens of micrometer across the active region, illustrated in FIG. 8b.

The invention claimed is:

1. A solution comprising a polymer, an organic semiconductor compound, and a solvent;
   wherein the semiconductor compound is a compound of formula (I):

wherein A is a phenyl group or a thiophene group, said phenyl group or thiophene group optionally being fused with a phenyl group or a thiophene group which can be unsubstituted or substituted with at least one group of formula X$^1$ and/or fused with a phenyl group, a thiophene group, or a benzothiophene group, any of said phenyl, thiophene, and benzothiphene groups being unsubstituted or substituted with at least one group of formula X$^1$; and each group X$^1$ may be the same or different and is selected from the group consisting of unsubstituted or substituted, straight, branched, or cyclic alkyl groups having from 1 to 20 carbon atoms; alkoxy groups having from 1 to 12 carbon atoms; amino groups that may be unsubstituted or substituted with one or two alkyl groups having from 1 to 8 carbon atoms, each of which may be the same or different; amido groups; silyl groups; unsubstituted or substituted alkenyl groups having from 2 to 12 carbon atoms; unsubstituted or substituted alkynyl groups having from 2 to 12 carbon atoms; halogens; boronic acids; diboronic acids; esters of boronic acids; esters of diboronic acids; and stannyl groups; and wherein the solvent is a mixture comprising a) one or more solvents selected from the group consisting of 4-methyl anisole, indane and an alkylbenzene with a linear or branched alkyl group containing from 4 to 7 carbon atoms; and b) one or more solvents selected from the group consisting of tetrahydronaphthalin and 1,2,4-trimethylbenzene.

2. The solution of claim 1, wherein the solvent mixture comprises a) one or more solvents selected from the group consisting of 4-methyl anisole, indane and an alkylbenzene with a linear or branched alkyl group containing from 4 to 7 carbon atoms; and b) one or more solvents selected from the group consisting of tetrahydronaphthalin and 1,2,4-trimethylbenzene; wherein the ratio of a) and b) is 10:1 to 1:10.

3. The solution of claim 2, wherein the solvent mixture comprises a) one or more solvents selected from the group consisting of 4-methyl anisole, indane, and an alkylbenzene with a linear or branched alkyl group containing from 4 to 7 carbon atoms; and b) one or more solvents selected from the group consisting of tetrahydronaphthalin and 1,2,4-trimethylbenzene; wherein the ratio of a) and b) is 5:1 to 1:5.

4. The solution of claim 1, wherein the compound of formula (I) is a compound of formulae (IIa) or (IIb):

5. The solution of claim 1, wherein the polymer comprises a repeat unit of formula (IIIa):

wherein $R^1$ and $R^2$ are the same or different and each is selected from the group consisting of hydrogen, an alkyl group having from 1 to 16 carbon atoms, an aryl group having from 5 to 14 carbon atoms and a 5-to 7-membered heteroaryl group containing from 1 to 3 sulfur atoms, oxygen atoms, selenium atoms, and/or nitrogen atoms, said aryl group or heteroaryl group being unsubstituted or substituted with one or more substituents selected from an alkyl group having from 1 to 16 carbon atoms and an alkoxy group having from 1 to 16 carbon atoms;

and a repeat unit of formula (IIIb):

wherein $Ar^1$ and $Ar^2$ are the same or different and each is selected from an aryl group having from 5 to 14 carbon atoms and a 5-to 7-membered heteroaryl group containing from 1 to 3 sulfur atoms, oxygen atoms, selenium atoms, and/or nitrogen atoms, said aryl group or heteroaryl group being unsubstituted or substituted with one or more substituents selected from an alkyl group having from 1 to 16 carbon atoms and an alkoxy group having from 1 to 16 carbon atoms;

$R^3$ is an alkyl group having from 1 to 8 carbon atoms or a phenyl group which may be unsubstituted or substituted with an alkyl group having from 1 to 8 carbon atoms;

and n is an integer greater than or equal to 1.

6. The solution of claim 5, wherein the polymer is [9,9'-dioctylfluorene-co-N-(4-butylphenyl)-diphenylamine] n, wherein n is greater than 50.

7. The solution of claim 5, wherein n is 1 or 2.

8. An active layer of an organic electronic device comprising the solution of claim 1.

9. The active layer of claim 8, wherein the organic electronic device is a field effect transistor.

10. The solution of claim 1, wherein the compound of formula (I) is a compound of the formula:

11. The solution of claim 1, wherein the compound of formula (I) is a compound of formula (Ie):

12. A method for preparing a semiconducting layer of an organic electronic device comprising:
(i) depositing said semiconducting layer from a solution comprising a polymer, an organic semiconductor compound, and a solvent, wherein the semiconductor compound is a compound of formula (I):

wherein A is a phenyl group or a thiophene group, said phenyl group or thiophene group optionally being fused with a phenyl group or a thiophene group which can be unsubstituted or substituted with at least one group of formula $X^1$ and/or fused with a phenyl group, a thiophene group, or a benzothiophene group, any of said phenyl, thiophene, and benzothiphene groups being unsubstituted or substituted with at least one group of formula $X^1$; and
each group $X^1$ may be the same or different and is selected from the group consisting of unsubstituted or substituted straight, branched, or cyclic alkyl groups having from 1 to 20 carbon atoms; alkoxy groups having from 1 to 12 carbon atoms; amino groups that may be unsubstituted or substituted with one or two alkyl groups having from 1 to 8 carbon atoms, each of which may be the same or different; amido groups; silyl groups; unsubstituted or substituted alkenyl groups having from 2 to 12 carbon atoms; unsubstituted or substituted alkynyl groups having from 2 to 12 carbon atoms; halogens; boronic acids; diboronic acids; esters of boronic acids; esters of diboronic acids; and stannyl groups;
and wherein the solvent is a mixture comprising a) one or more solvents selected from the group consisting of 4-methyl anisole, indane and an alkylbenzene with a linear or branched alkyl group containing from 4 to 7 carbon atoms; and b) one or more solvents selected from the group consisting of tetrahydronaphthalin and 1,2,4-trimethylbenzene; and
(ii) treating said deposited layer to evaporate said solvent.
13. The method of claim 12, wherein depositing is carried out by inkjet printing.

14. The method of claim 12, wherein said organic electronic device is an organic thin film transistor.
15. A method of making an organic thin film transistor comprising a substrate, source and drain electrodes having a channel region located in between them, a semiconducting layer extending across the channel region and in electrical contact with the source and drain electrodes, a gate electrode and an insulating layer between the gate electrode and the semiconducting layer, wherein the semiconducting layer is deposited from a solution comprising a polymer, an organic semiconductor compound, and a solvent, wherein the semiconductor compound is compound of formula (I):

wherein A is a phenyl group or a thiophene group, said phenyl group or thiophene group optionally being fused with a phenyl group or a thiophene group which can be unsubstituted or substituted with at least one group of formula $X^1$ and/or fused with a phenyl group, a thiophene group, or a benzothiophene group, any of said phenyl, thiophene, and benzothiphene groups being unsubstituted or substituted with at least one group of formula $X^1$; and
each group $X^1$ may be the same or different and is selected from the group consisting of unsubstituted or substituted straight, branched, or cyclic alkyl groups having from 1 to 20 carbon atoms; alkoxy groups having from 1 to 12 carbon atoms; amino groups that may be unsubstituted or substituted with one or two alkyl groups having from 1 to 8 carbon atoms, each of which may be the same or different; amido groups; silyl groups; unsubstituted or substituted alkenyl groups having from 2 to 12 carbon atoms; unsubstituted or substituted alkynyl groups having from 2 to 12 carbon atoms; halogens; boronic acids; diboronic acids; esters of boronic acids; esters of diboronic acids; and stannyl groups;
and wherein the solvent is a mixture comprising a) one or more solvents selected from the group consisting of 4-methyl anisole, indane and an alkylbenzene with a linear or branched alkyl group containing from 4 to 7 carbon atoms; and b) one or more solvents selected from the group consisting of tetrahydronaphthalin and 1,2,4-trimethylbenzene, followed by heating said deposited layer to evaporate said solvent.
16. An organic electronic device obtainable by the method of claim 15.

* * * * *